United States Patent [19]

Wade et al.

[11] Patent Number: 5,068,715
[45] Date of Patent: Nov. 26, 1991

[54] HIGH-POWER, HIGH-PERFORMANCE INTEGRATED CIRCUIT CHIP PACKAGE

[75] Inventors: Paul C. Wade, Shirley; JJ Grady, III, Acton, both of Mass.

[73] Assignee: Digital Equipment Corporation, Maynard, Mass.

[21] Appl. No.: 546,569

[22] Filed: Jun. 29, 1990

[51] Int. Cl.⁵ .......................................... H01L 23/02
[52] U.S. Cl. ...................................... 357/81; 357/80; 357/74; 437/221; 437/902; 361/386
[58] Field of Search ...................... 357/65, 74, 80, 81; 361/381, 386; 174/16.3, 16.2; 165/104.33; 437/902, 221

[56] References Cited

U.S. PATENT DOCUMENTS

| 3,904,886 | 9/1975 | Ehling et al. | 307/89 |
| 4,021,838 | 5/1977 | Warwick | 357/68 |
| 4,237,552 | 12/1980 | Thompson | 361/392 |
| 4,266,282 | 5/1981 | Henle et al. | 365/52 |
| 4,295,183 | 10/1981 | Miersch et al. | 361/403 |
| 4,322,778 | 3/1982 | Barbour et al. | 361/414 |
| 4,328,530 | 5/1982 | Bajorek et al. | 361/308 |
| 4,426,689 | 1/1984 | Henle et al. | 365/52 |
| 4,495,377 | 1/1985 | Johnson et al. | 174/68.5 |
| 4,575,744 | 3/1986 | Caldwell et al. | 357/45 |
| 4,577,214 | 3/1986 | Schaper | 357/45 |
| 4,620,215 | 10/1986 | Lee | 357/81 |
| 4,628,411 | 12/1986 | Balderess et al. | 361/414 |
| 4,649,417 | 3/1987 | Burgess et al. | 357/80 |
| 4,667,220 | 5/1987 | Leeset et al. | 357/71 |
| 4,675,717 | 6/1987 | Herrero et al. | 357/71 |
| 4,688,151 | 8/1987 | Kraus et al. | 361/405 |
| 4,727,410 | 2/1988 | Higgins | 357/74 |
| 4,774,559 | 9/1988 | Culican et al. | 357/45 |
| 4,809,058 | 2/1989 | Funamoto et al. | 357/82 |
| 4,814,857 | 3/1989 | Werbizky | 357/74 |
| 4,899,208 | 2/1990 | Dietsch et al. | 357/74 |

FOREIGN PATENT DOCUMENTS 3318729 11/1984 Fed. Rep. of Germany ........ 357/81

OTHER PUBLICATIONS

Miyoshi et al., 1989 IEEE International Solid State; Circuits Conference; "A 50K-Gate ECL Array with Substrate Power Supply", pp. 182-184.

Primary Examiner—William Mintel
Assistant Examiner—David Ostrowski
Attorney, Agent, or Firm—Kenyon & Kenyon

[57] ABSTRACT

The high-power, high-performance integrated circuit chip package comprises a chip constructed to contain top and bottom surfaces to which top and bottom metallization planes are fixed. Top and bottom heat sinks are fixedly mounted to the top metallization plane and bottom metallization plane, respectively. The metallization planes and heat sink combination functions as both a power lead and a heat dissipation means, allowing for the chip to contain signal connections which may be dedicated to input and output signal paths. The chip further comprises a plurality of contiguous top layers of thin dielectric material, at least one epitaxial layer on whichis mounted a plurality of transistors and associated circuitry, and at least one bottom layer of crystalline silicon material. The plurality of transistors and associated circuitry generates heat. Such heat may then be dissipated by following a first or second thermal path, the first path proceeding through the plurality of contiguous top layers, through the top metallization plane to the top heat sink and the second thermal path proceeding through at least one bottom layer through the bottom metallization plane to the bottom heat sink.

27 Claims, 2 Drawing Sheets

HIGH-POWER, HIGH-PERFORMANCE INTEGRATED CIRCUIT CHIP PACKAGE

FIELD OF THE INVENTION

This invention relates to chip packaging for integrated circuits. More particularly it relates to an integrated chip package with improved cooling and power distribution characteristics.

BACKGROUND OF THE INVENTION

In the design of integrated circuit chips, there is an inherent presence of competing interests grounded in the concept of deriving greater computing power and better performance from a smaller, more dense chip. As the push towards miniaturization of integrated circuit chips increases, designers face some practical limitations to further miniaturization. Such limitations include the number of signal connectors available to satisfy the greater number of transistors and associated circuitry contained on the miniaturized chips, and means to effectively handle heat dissipation generated by the increased number of components on the chip. Furthermore, even when manufacturers increase the surface area of the chip, the result of the circuit miniaturization presents the similar problem of insufficient peripheral surface area to mount the signal connectors. For example, in the construction of very large scale integrated circuits (VLSI circuits), the number of transistors which can be placed on a particular chip, being a function of the surface area of that chip, allows VLSI circuit chips to contain many thousand transistors per square centimeter. Signal connectors have not, to date, been sufficiently reduced in size to accommodate the increased number of transistors.

Current integrated circuit chip designs largely call for power connections to be interspersed among the signal connectors to the integrated circuit chip. For example, in high powered chip designs using a normal 5 volt driving voltage, a chip rated for 50 watts will require approximately 10 amperes of driving current. If one assumes that each signal connection (or lead) can carry about 0.25 amperes, and assuming that 2 leads are required to complete a given electrical path, 80 leads are required just to power the chip. Such connection requirements can severely restrict signal connection to transistor logic located within an integrated circuit chip.

Prior art solutions have only been marginally successful in addressing this connection problem. Such solutions have been directed to the use of one or more leads to supply a ground connection and one or more driving voltage connections. The essence of prior art solutions has been to place at least one layer of metallized material in between other layers of dielectric material to provide a power source to drive the transistor circuitry contained on the surface of the integrated circuit chip. The power source is then made available to transistors and other circuit components by providing holes, or "vias" in the dielectric material.

When the chip circuitry requires voltages of varying levels, prior art solutions have called for a plurality of metallized planes to be placed at various points in the dielectric layers. Another solution has been to provide a single metallized planar power lead with step down resistive networks or operational amplifier (voltage divider) networks located on the surface of the integrated circuit chip.

Although the prior art solutions have somewhat resolved the problem of insufficient signal connections, such solutions have themselves introduced new problems. For example, providing thin metallized planar power supplies sandwiched between dielectric layers resulted in significant resistance for such metallized planes and resultant voltage drops across these planes. These voltage drops could potentially effect logic levels throughout the integrated circuit chip. Also, current density in such thin metallized planes had been high enough to cause what is known as electromigration in the metal. Electromigration is an atomic flux induced in conductors which may be created by a momentum transfer of electrons and tends to reduce the reliability of integrated circuit chips.

It is also known that electromigration of metals is a function of such variables as the density of metallic ions in a conductor, the current density, the diffusion rate, the resistivity of the conductor and the temperature, among other things. Thin metallized planes are known to be more prone to electromigration because of their higher diffusion rates and higher resistivity.

Thermal performance of high-speed, high-power, integrated circuit chips, for example, bipolar integrated circuit chips, has in the past been inadequate to allow for power levels in excess of 100 watts. Traditionally, thermal power dissipated in an integrated circuit chip is conducted through the semiconductor substrate (dielectric) to a heat sink attached to the underside of the chip, away from active circuitry, while the power lead current is delivered to the front active planar circuitry through metallized planes.

State of the art digital integrated circuits can contain more than 100,000 transistors. When filled with high speed logic circuitry, power in excess of 100 watts would be thermally dissipated, if designed for optimum performance. This magnitude of power is very difficult to remove from the relatively small area of an integrated circuit chip. Also, operation at a typical power lead voltage of 5 volts requires the delivery of currents greater than 20 amperes to microscopic structures composed of a dielectric material. This dielectric material, as a result, is exposed to high amperage, significant heat buildups, thermal expansion and resultant thermal stress. Reasonable temperature of the metal/dielectric junction is critical to integrated circuit chip reliability, thereby requiring thermal dissipation techniques to keep pace with increase in power requirements.

SUMMARY OF THE INVENTION

The present invention provides for high-speed, high-power, bipolar integrated circuit chips to be equipped with a maximum amount of signal connections without the need to reserve such connections for the power requirements of the chip. The invention is directed to an integrated circuit chip using top and bottom metallization planes to act as both power connections and heat dissipation devices.

The high-power, high performance integrated circuit chip package of the present invention comprises a chip constructed, in part, of a dielectric material. The dielectric material comprises a plurality of contiguous top layers each of which may be of a first predetermined thickness. The chip also includes at least one bottom layer which may be of a second predetermined thickness and at least one epitaxial layer of high purity doped silicon. A plurality of signal connectors are positioned around the periphery of the chip. The chip also includes a top heat sink and a bottom heat sink fixedly mounted to the top and bottom metallization planes, respectively.

The top and bottom heat sinks provide the power source for the transistors and associated circuitry mounted on at least one epitaxial layer of the chip. The top and bottom heat sinks also each act as a physical terminus of a thermal path for heat dissipation. A first thermal path proceeds from the transistor dielectric layer, through the plurality of contiguous top layers and the top metallization plane to the top heat sink. A second thermal path proceeds similarly from the transistor dielectric layer, through the bottom layer and the bottom metallization plane to the bottom heat sink. Such first and second thermal paths are inherent in the chip by virtue of heat dissipation properties of the top layers, the bottom layer, the top and bottom metallization planes and the top and bottom heat sinks. These paths are therefore not necessarily to be construed as separate and distinct physical paths through the chip.

The top metallization plane couples to the top heat sink and comprises a first power lead which may be a positive power lead, the top metallization plane having a low resistance. The bottom metallization plane couples to the bottom heat sink and comprises a second power lead which may be a negative power lead, the bottom metallization plane having low resistance. The polarity of the top and bottom metallization planes can be switched if so needed by the circuitry.

The top metallization plane may act as the positive power lead for transistors and associated circuitry which are mounted within the epitaxial layer of the integrated circuit chip. Although the integrated circuit chip top surface positioned directly beneath the top metallization plane is not mechanically polished as the integrated circuit chip bottom surface, the imperfections found therein are typically less than 1 micron in depth, thereby providing excellent mating surface for the top metallization plane.

The transistors and associated circuitry are coupled to the top metallization plane, carrying the positive power lead, through first "vias" or passageways, which are chemically etched into the dielectric material. A plurality of first vias extend from the top metallization plane through the plurality of contiguous top layers to the plurality of transistors and associated circuitry. Each of these first vias contain a first conductive material to provide an electrical path to the circuitry. Similarly, a plurality of second vias are present in the chip, extending from the bottom metallization plane which is affixed to the underside of the integrated circuit chip abutting the mechanically polished bottom surface, through at least one bottom layer to the plurality of transistors and associated circuitry. Each of these second vias are filled with a second conductive dopant to provide an electrical path to the circuitry. The transistors and associated circuitry found within the epitaxial layer are coupled to the negative power lead through these second vias which may be chemically etched into the dielectric material or created by an ion implantation process.

The present invention allows for state-of-the-art digital integrated circuits, particularly bipolar digital integrated circuits containing more than 100,000 transistors to contain high speed logic circuitry and dissipate power in excess of 100 watts. Furthermore, the present invention provides a way of utilizing both surfaces, including their respective heat sinks, of the high-power, high-performance integrated circuit chip, to dissipate large amounts of thermal power and to simultaneously deliver large currents (greater than 20 amperes) with minimum voltage differentials across the chip planar layers.

In addition to the electrical benefits derived from the top and bottom metallization planes on the integrated circuit chip, such metallization planes and their respective heat sinks also provide excellent thermal conductivity to dissipate internally generated heat. The ability of a particular material to dissipate heat is a function of its thermal impedance, which is a function of the material's thermal conductivity and thickness, among other things. The thermal impedance is maintained at a minimum, with regard to the first thermal path to the top metallization plane and top heat sink, since the layered construction of the dielectric allows for contiguous layers of thin (0.1-10 micron) dielectric material. The dielectric material comprising the first thermal path is typically constructed of a silicon dioxide or silicon nitride material.

The second thermal path to the bottom metallization plane and bottom heat sink is similarly typically constructed to be of low thermal impedance as it proceeds through the bottom layer comprising approximately 0.5 millimeters of a crystalline silicon material (single crystal silicon), considered to be a good thermal conductor. Thermal conductivity is maintained despite the method employed for fixing top and bottom metallization planes to their respective heat sinks since even soldering composites are thermally matched resulting in only slight reduction in thermal conductivity (for example use of copper-tungsten, silver-tungsten composites).

The present invention resolves the problem arising from a multiplicity of power connections, as it requires only two power lead connections comprising the top heat sink and the bottom heat sink. The remaining connections on the chip therefore are reserved for signal connection use. The present invention similarly resolves the problem of heat buildup in high power integrated circuit chips by providing inherent thermal paths to heat dissipation with such paths constructed to be of low thermal impedance.

DETAILED DESCRIPTION

Figure 1:
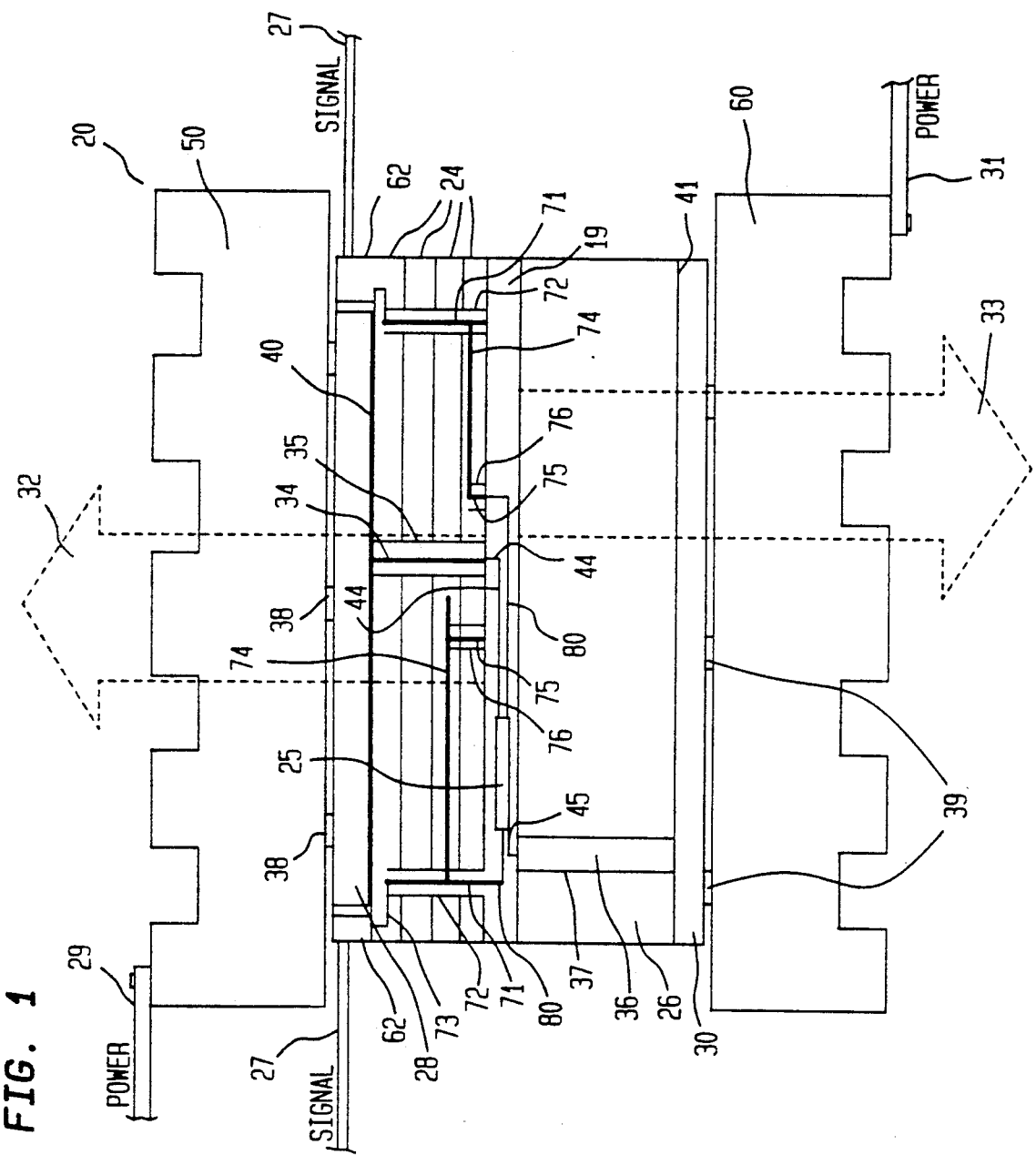
FIG. 1 is a side cross-sectional view of an integrated circuit employing top and bottom metallized planes and top and bottom heat sinks for improved cooling and power distribution, according to the present invention.

Referring now to FIG. 1 there is illustrated the integrated circuit chip with improved cooling and power distribution characteristics in accordance with the present invention. The high-power, high-performance integrated chip package comprises a chip 20 constructed, in part, of a dielectric material. The chip 20 is constructed such that a top metallization plane 28 fixedly mounts to the dielectric material on one side, and to a top heat sink 50 on the other side. Such mounting on the heat sink 50 side may include, for example, a mechanical compression alone, or in conjunction with an adhesive element. The chip 20 is further constructed to include a bottom metallization plane 30 fixedly mounted to a bottom layer 26 on one side, and a bottom heat sink 60 on the other side. Such mounting on the side of the heat sink 60, may similarly comprise, for example, a mechanical compression alone, or in conjunction with an adhesive element.

The top heat sink 50 may comprise a metallic material or other such material having a high thermal conductivity. Similarly, the bottom heat sink 60 may also comprise a metallic material or other such material having a high thermal conductivity.

The dielectric material of the chip 20 comprises a plurality of contiguous top layers 24. The chip 20 also includes at least one epitaxial layer 19 comprising very high purity doped silicon and at least one bottom layer 26. Each contiguous top layer 24 may have a thickness in the range of 0.1 to 10 microns. It is the preferred embodiment of the present invention for each of the top layers 24 to be of a uniform thickness. Each bottom layer 26 is similarly constructed to have a thickness of approximately 0.5 mm. The dielectric material chosen for each contiguous top layer 24 may differ, but typically each contiguous top layer 24 may comprise a silicon dioxide material, silicon nitride material or materials including polyimides or other organic dielectrics. Each bottom layer 26 comprises a crystalline silicon material (single crystal silicon). Alternatively, the bottom layer 26 may comprise Gallium Arsenide.

The chip 20 contains a plurality of signal connections 27 distributed around the periphery of the chip 20. The signal connections 27 are each coupled to a bonding pad 62, the bonding pad 62 fixedly mounted to the dielectric material of the chip 20. Each of the bonding pads 62 comprises an electrical conductor.

The top metallization plane 28 is coupled to at least one of the plurality of transistors and associated circuitry 25 located on at least one epitaxial layer 19 of the chip 20. The top metallization plane 28 is further coupled to a first power lead 29 having a first polarity. The polarity of the first power lead 29 in this case could be a positive polarity, a negative polarity or a ground connection.

The bottom metallization plane 30 is coupled to at least one of the plurality of transistors and associated circuitry 25, and is also coupled to a second electrical power lead 31 having a second polarity. The polarity of the second electrical power lead 31 can, in this instance be a positive polarity, a negative polarity, or a ground connection.

The transistors and associated circuitry 25 need to be coupled to the first and second power supplies 29 and 31, respectively in order to be operative. Also, the transistors and associated circuitry 25 may be coupled to a signal connection 27 (See FIG. 2).

The top metallization plane 28 may comprise a copper material, an aluminum material or other such conductive metal. A top side of the top metallization plane 28, being fixedly mounted to the top heat sink 50 may be so mounted using a first soldering composite 38, the first soldering composite 38 having a thermal conductivity which approximates that of the top metallization plane 28. The first soldering composite 38 may comprise conventional soldering materials or other more exotic materials e.g., a copper-tungsten material or a silver-tungsten material, dependent upon the material of the top metallization plane 28 itself.

As with the top metallization plane 28, the bottom metallization plane 30 is fixedly mounted to the bottom heat sink 60 by soldering the plane 30 in place. A second soldering composite 39 is utilized to accomplish this task, the second soldering composite 39 having a thermal conductivity which approximates that of the bottom metallization plane 30. The second soldering composite 39 may comprise conventional soldering materials or other more exotic materials, e.g., a copper-tungsten material or a silver-tungsten material dependent upon the material of the bottom metallization plane 30 itself. For the purposes of this invention, the bottom metallization plane 30 may be comprised of a copper material, an aluminum material, or other conductive metal such as gold.

In order for the top metallization plane 28 and the bottom metallization plane 30 to be respectively coupled to at least one of the plurality of transistors and associated circuitry 25 found on the epitaxial layer 19 a passageway of some sort must be constructed in the chip 20. Such passageways are etched into the dielectric material of the chip 20 and are referred to as first vias 35. Such first vias 35 extend through the chip 20 to provide a passageway from the top metallization plane 28 to the epitaxial layer 19. Each first via 35 contains a first conductive material 34 such as a metallic conductor so that each first via 35 becomes a conductive passageway from the top metallization plane 28 to the epitaxial layer 19 of the chip 20.

The bottom metallization plane 30 is similarly coupled to at least one of the plurality of transistors and associated circuitry 25 mounted on the epitaxial layer 19. A plurality of second vias 37 are employed for this purpose, providing passageways from the bottom metallization plane 30 to the circuitry 25. Alternatively, the entire bottom layer 26 may be doped to provide a coupling of the bottom metallization place 30 to the circuitry 25. Each second via 37 extends through the dielectric material of the chip 20 to the epitaxial layer 19. Each second via 37 is completely filled with a second conductive dopant 36 having an electrical conductivity substantially greater than the dielectric material, such that each second via 37 becomes a conductive passageway from the bottom metallization plane 30 to one of the plurality of transistors and associated circuitry 25 mounted on the epitaxial layer 19.

The signal connections 27 also couple to at least one of the plurality of transistors and associated circuitry 25 mounted on the epitaxial layer 19. A plurality of third vias 72 are employed for this purpose, providing, for example, passageways from the bonding pad 62 to the circuitry 25. Each third via 72 may extend through the dielectric material of the chip 20 to the epitaxial layer 19. Each third via 72 contains a third conductive material 71, for example, a metallic conductor. The third conductive material 71 couples to a second conductive material 73, for example, a metallic conductor which in turn couples to the bonding pad 62. The third conductive material may also couple directly to at least one of the plurality of transistors and associated circuitry 25 by coupling a fifth conductive material 80 to the third conductive material 71 and the circuitry 25. Alternatively, the third conductive material 73 may couple to a first conductive plane 74, for example, a metallic plane extending, for example, along one of the plurality of contiguous top layers 24 in a parallel position to the top and bottom metallization planes, 28 and 30. The first conductive plane couples to at least one of the plurality of transistors and associated circuitry 25 by a fourth conductive material 75, for example, a metallic conductor, contained within a fourth via 76. Such fourth via extends from the first conductive plane 74 to the circuitry 25.

The construction of top metallization plane 28 as well as bottom metallization plane 30 is such that the planes 28 and 30 can deliver high amperage and simultaneously maintain a stable voltage over the entire surface of the respective planes 28 and 30. This is because the metallization planes 28 and 30 are constructed to be thick enough to possess relatively low resistance. As a result, voltage drops across the planes 28 and 30 are insignificant with respect to such voltage drops affecting logic levels.

The top and bottom metallization planes 28 and 30 are also integral parts of the thermal dissipation characteristics of the high-power, high-performance integrated circuit chip package of the present invention. Within the chip 20, is a first thermal path 32 extending through the chip 20 to the atmosphere. First thermal path 32 extends from the epitaxial layer 19, on which is mounted the plurality of transistors and associated circuitry 25, through the plurality of contiguous top layers 24, through the top metallization plane 28 and through the top heat sink 50. Such path 32 allows heat to be dissipated to the atmosphere or contiguous material. The first thermal path 32 is not necessarily a distinct physical path, but preferably an inherent path created by virtue of heat dissipation properties of the elements of the chip 20. Heat which is generated by the plurality of transistors and associated circuitry 25 is thermally conducted in accordance with this first thermal path 32. Since each of the plurality of contiguous top layers 24 is constructed to be of a thickness between 1 and 2 microns, the thermal conductivity of such layers 24 is relatively high.

In the context of maintaining high thermal conductivity, a top surface 40 of the chip 20 is constructed such that imperfections in the surface 40, due to the plurality of contiguous top layers 24 being placed over conductors in the epitaxial layer 19, are limited to those of a depth of 1 micron or less. The smoothness of surface 40 results in an excellent thermal mating surface of the top surface 40 with the top metallization plane 28. Thermal conductivity is thereby enhanced by such smoothness.

A second thermal path 33 exists within the chip 20 and extends from the epitaxial layer 19 which contains the plurality of transistors and associated circuitry 25, through the bottom layer 26 of the chip 20 through the bottom metallization plane 30, and through the bottom heat sink 60, such that heat can be dissipated to the atmosphere. Once again, the second thermal path 33 is not a distinct physical path, but rather an inherent path created by thermal dissipation properties of the elements comprising the chip 20.

Thermal conductivity in the second thermal path 33 is also maximized since path 33 will extend through bottom layer 26 and each bottom layer 26 comprises a crystalline silicon material which may have a thickness of approximately 0.5 mm. Crystalline silicon is considered in the art to be a good thermal conductor, thereby maintaining the thermal conductivity of second thermal path 33.

A bottom surface 41 of the chip 20 differs from the top surface 40 in that the bottom surface 41 is polished. Such polished bottom surface 41 enhances thermal conductivity as it allows for an excellent mating surface of the bottom metallization plane 30 to the bottom surface 41 of the chip 20.

Figure 2:
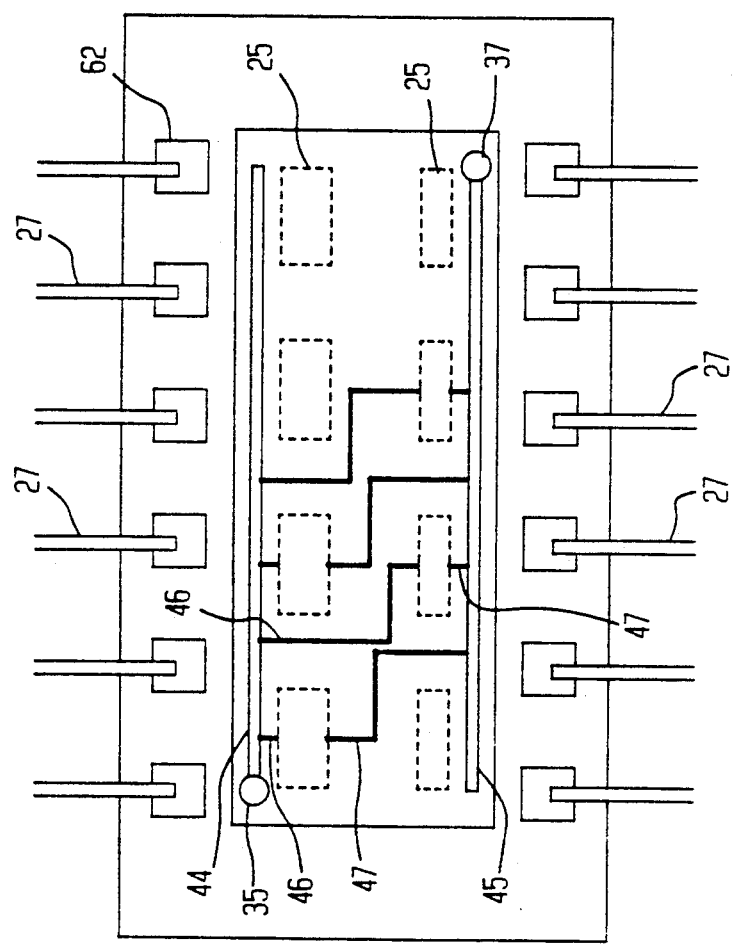
FIG. 2 is a top plan view of transistors and associated circuitry located on an integrated circuit chip.

Referring now to FIG. 2, there is illustrated a top plan view of the horizontally dissected chip 20 of FIG. 1. The construction of the epitaxial layer 19 is therefore shown. The signal connections 27 are shown along the periphery of the chip 20 in a fashion which maximizes the number of signal connections 27 for the space provided. The signal connections 27 are each coupled to one or more of the plurality of transistors and associated circuitry 25 mounted on the epitaxial layer 19. Each of the plurality of transistors and associated circuitry 25 is connected to a first power lead 29 and a second power lead 31. Such connections enable the plurality of transistors and associated circuitry 25 to be powered up.

The coupling of the first and second power supplies 29 and 31 respectively, may be implemented in the following embodiment. The first power lead 29 couples to the first conductive pathway (not shown), which in turn couples to the first conductive material 34 (See FIG. 1) in the first via 35. The first conductive material 34 also couples to a second conductive pathway 44 which in turn couples to at least one transistor and associated circuitry 25 by a third conductive pathway 46.

The second power lead 31 may similarly be coupled to a fourth conductive pathway (not shown), which in turn couples to the second conductive dopant 36 (See FIG. 1). The second conductive dopant 36 also couples to a fifth conductive pathway 45 which couples to at least one transistor and associated circuitry 25 by a sixth conductive pathway 47.

What is claimed is:

1. An integrated circuit chip package which comprises:
    a chip comprising a dielectric material, having top and bottom surfaces;
    a plurality of transistors and associated circuitry fabricated in an epitaxial layer within said chip;
    a plurality of signal connectors coupled to said transistors and associated circuitry;
    a top metallization plane fixedly mounted to said top surface;
    a top heat sink fixedly mounted to said top metallization plane to provide a thermal and electrical coupling between said top heat sink and said top metallization plane;
    said top metallization plane electrically coupled to said plurality of transistors and associated circuitry and further coupled through said top heat sink to a first electrical power source having a first polarity;
    a bottom metallization plane fixedly mounted to said bottom surface;
    a bottom heat sink fixedly mounted to said bottom metallization plane to provide a thermal and electrical coupling between the bottom heat sink and the bottom metallization plane;
    said bottom metallization plane electrically coupled to said plurality of transistors and associated circuitry and further coupled through said bottom heat sink to a second electrical power source having a second polarity;
    a first thermal path for dissipation of heat said first thermal path originating at said plurality of transistors and associated circuitry and passing through said dielectric material, said top metallization plane and said top heat sink; and
    a second thermal path for dissipation of heat, said second thermal path originating at said plurality of transistors and associated circuitry and passing through said bottom layer of said dielectric material, said bottom metallization plane and said bottom heat sink.

2. The integrated circuit chip package of claim 1, wherein said dielectric material comprises a plurality of contiguous top layers, said top layers having a predetermined first thickness and at least one bottom layer, said bottom layer having a predetermined second thickness.

3. The integrated circuit chip package of claim 2, wherein said predetermined first thickness is from 0.1 to ten microns.

4. The integrated circuit chip package of claim 2, wherein said predetermined second thickness is approximately 0.5 millimeters.

5. The integrated circuit chip package of claim 2, wherein said top layers comprise silicon dioxide.

6. The integrated circuit chip package of claim 2, wherein said top layers comprise silicon nitride.

7. The integrated circuit chip package of claim 2, wherein said bottom layer comprise crystalline silicon or gallium arsenide.

8. The integrated circuit chip package of claim 1, wherein said top metallization plane is soldered to said top heat sink using a first soldering composite having a thermal conductivity which approximates that of said top metallization plane.

9. The integrated circuit chip package of claim 1, wherein said bottom metallization plane is soldered to said bottom heat sink using a second soldering composite having a thermal conductivity which approximates that of said bottom metallization plane.

10. The integrated circuit chip package of claim 1, wherein said top metallization plane comprises copper 11. The integrated circuit chip package of claim 1, wherein said top metallization plane comprises aluminum.

12. The integrated circuit chip package of claim 1, wherein said bottom metallization plane comprises copper.

13. The integrated circuit chip package of claim 1, wherein said bottom metallization plane comprises aluminum.

14. The integrated circuit chip package of claim 8, wherein said first soldering composite comprises a copper-tungsten material.

15. The integrated circuit chip package of claim 8, wherein said first soldering composite comprises a silver-tungsten material.

16. The integrated circuit chip package of claim 9, wherein said second soldering composite comprises a copper-tungsten material.

17. The integrated circuit chip package of claim 9, wherein said second soldering composite comprises a silver-tungsten material.

18. The integrated circuit chip package of claim 1, wherein said first polarity is positive and said second polarity is negative.

19. The integrated circuit chip package of claim 1, wherein said first polarity is a negative and said second polarity is a positive.

20. The integrated circuit chip package of claim 1, wherein said coupling of said top metallization plane to said plurality of transistors and associated circuitry includes a coupling of said top metallization plane to a first conductive material contained within a first via, said first via having been chemically etched into said dielectric material, said first conductive material further coupled to said plurality of transistors and associated circuitry.

21. The integrated circuit chip package of claim 20, wherein said conductive material comprises a metallic conductor.

22. The integrated circuit chip package of claim 1, wherein said coupling of said bottom metallization plane to said plurality of transistors and associated circuitry includes a coupling of said bottom metallization plane to a second conductive dopant deposited in a second via and having an electrical conductivity substantially greater than said dielectric material, said second via having been chemically etched or formed by ion implantation into said dielectric material, said second conductive dopant further coupled to said plurality of transistors and associated circuitry.

23. A method of cooling and powering an integrated circuit chip package having a dielectric material with top and bottom surfaces and a plurality of transistors and associated circuitry fabricated in an epitaxial layer, comprising the steps of:

fixedly mounting a top heat sink to a top metallization plane;

coupling a first electrical power lead having a first polarity to the top metallization plane through the top heat sink;

fixedly mounting the top metallization plane to the top surface of the dielectric material;

providing a thermal and electrical coupling between the top heat sink and the top metallization plane;

fixedly mounting a bottom heat sink to a bottom metallization plane;

coupling a second electrical power lead having a second polarity to the bottom metallization plane through the bottom heat sink;

fixedly mounting the bottom metallization plane to the bottom surface of the dielectric material;

providing a thermal and electrical coupling between the bottom heat sink and the bottom metallization plane;

coupling the top metallization plane and the bottom metallization plane to a plurality of transistors and associated circuitry fabricated in an epitaxial layer within a chip;

providing a first thermal path for dissipation of heat, said first thermal path originating at the plurality of transistors and associated circuitry and passing through a first portion of the dielectric material, the top metallization plane and the top heat sink; and providing a second thermal path for dissipation of heat, said second thermal path originating at the plurality of transistors and associated circuitry and passing through a second portion of the dielectric material, the bottom metallization plane and the bottom heat sink.

24. The method of claim 23 wherein the first polarity is positive and the second polarity is negative.

25. The method of claim 23 wherein the first polarity is negative and the second polarity is positive.

26. The method of claim 23 wherein the step of coupling the first electrical power lead further comprises the step of:

providing the dielectric material with at least one first via extending for at least a first portion therethrough, the first via containing a first conductive material;

coupling the top metallization plane to the first conductive material; and coupling the first conductive material to the plurality of transistors and associated circuitry.

27. The method of claim 23 wherein the step of coupling the second electrical power lead further comprises the steps of:
proving the dielectric material with at least one second via extending for at least a second portion therethrough, the second via to be filled with a second conductive dopant having an electrical conductivity substantially greater than the dielectric material;
coupling the bottom metallization plane to the second conductive dopant; and
coupling the second conductive dopant to the plurality of transistors and associated circuitry.

* * * * *